US 6,710,317 B2

(12) United States Patent
Meadows

(10) Patent No.: US 6,710,317 B2
(45) Date of Patent: Mar. 23, 2004

(54) CURRENT TO VOLTAGE CONVERTER WITH OPTICAL GAIN MECHANISM

(76) Inventor: Robert David Meadows, 14960 NW. Newberry Rd., Portland, OR (US) 97214

( * ) Notice: Subject to any disclaimer, the term of this patent is extended or adjusted under 35 U.S.C. 154(b) by 247 days.

(21) Appl. No.: 10/085,905

(22) Filed: Feb. 27, 2002

(65) Prior Publication Data

US 2002/0079428 A1 Jun. 27, 2002

Related U.S. Application Data

(63) Continuation-in-part of application No. 09/549,984, filed on Apr. 14, 2000.

(51) Int. Cl.$^7$ .................................................. G01I 1/32
(52) U.S. Cl. ........................ 250/205; 250/551; 327/345
(58) Field of Search ............................ 250/551, 214 A, 250/214 LA, 214 AG, 214 C, 206, 205, 238; 327/345, 514

(56) References Cited

U.S. PATENT DOCUMENTS

| | | | | |
|---|---|---|---|---|
| 4,074,143 A | * | 2/1978 | Rokos .......................... 250/552 |
| 4,275,307 A | * | 6/1981 | Struger et al. ............... 250/551 |
| 4,565,962 A | * | 1/1986 | Nagano ....................... 323/351 |
| 4,636,655 A | * | 1/1987 | Nagano ....................... 327/104 |
| 4,652,764 A | * | 3/1987 | Nagano ....................... 250/551 |
| 4,678,946 A | * | 7/1987 | Nagano ....................... 327/334 |
| 4,739,174 A | * | 4/1988 | Nagano ....................... 250/551 |
| 4,752,693 A | * | 6/1988 | Nagano ....................... 250/551 |
| 5,189,307 A | * | 2/1993 | Fabian ......................... 250/551 |
| 5,278,515 A | * | 1/1994 | Mathews ....................... 330/59 |
| 5,283,441 A | * | 2/1994 | Fabian ......................... 250/551 |
| 5,432,470 A | * | 7/1995 | Sasaki ......................... 327/514 |
| 5,729,584 A | * | 3/1998 | Moorman et al. ........... 378/146 |

\* cited by examiner

Primary Examiner—Edward J. Glick
Assistant Examiner—Hoon Song
(74) Attorney, Agent, or Firm—Kolisch Hartwell, P.C.

(57) ABSTRACT

The present invention creates a current to voltage conversion system, comprised of an operational amplifier, which obtains a feedback current from an optical detector. The output of the operational amplifier controls the intensity of a light source whose optical energy is transmitted through an optical intensity reduction mechanism, to generate the feedback current. A separate light intensity measurement system is constructed to measure the output of the light source directly, bypassing the effects of the optical intensity reduction mechanism. By measuring the light source, the magnitude of the input current can be determined. The increased illumination created by using an optical reduction mechanism within the operational amplifier's feedback loop allows the separate light source intensity measurement system to be easily constructed using conventional technologies.

20 Claims, 18 Drawing Sheets

CURRENT TO VOLTAGE CONVERTER WITH OPTICAL GAIN MECHANISM

CROSS-REFERENCE TO RELATED APPLICATIONS

This application is a continuation-in-part of U.S. patent application Ser. No. 09/549,984, which was filed Apr. 14, 2000.

STATEMENT REGARDING FEDERALLY SPONSORED RESEARCH OR DEVELOPMENT

Not Applicable.

REFERENCE TO A MICROFICHE APPENDIX

Not Applicable.

BACKGROUND OF THE INVENTION

This invention relates to an electronic current conversion or measurement technique, specifically to a method to use optical intensity modification within an operational amplifier circuit's feedback loop to create gain.

Current to voltage converter circuits transform an input current level into an output voltage level. Many different types of electronic systems are constructed with current to voltage converters as major subcomponents. Current to voltage converters are discussed in most basic electronic textbooks because of their fundamental usefulness.

The most often implemented current to voltage conversion circuit, when a virtual ground is desired at the input node, uses an operational amplifier circuit with the positive input node connected to ground. A feedback element, normally a resistor when linear response is desired, is connected to the operational amplifier's output and feeds current from the voltage output of the operational amplifier back to the negative input node of the operational amplifier. The input current to be converted to a voltage is connected to the negative input node of the operational amplifier. The output voltage for an operational amplifier, operating within the normal linear range, will be such that the current flowing into the negative input node will be matched in magnitude but opposite in polarity from the current flowing into the negative input node from the feedback element. If a linear feedback element is used, like a resistor, then the output voltage is equal to the negation of the input current times the ohmage of the resistor. When increased voltage output is desired for an arbitrary input current level, the value of the feedback resistor is increased. As the value of the feedback resistor is increased some real world problems are encountered. High value resistors are very expensive to make stable with respect to time, temperature, and humidity. The feedback resistor adds significant noise to the output when compared to low noise input sources, for example photodiodes used to measure light intensity levels. The high resistance of the feedback resistor combined with the capacitance of many sensors, like a large area photodiode, result in a limited frequency response. A feedback capacitor must be added in parallel with the feedback resistor to maintain the operational amplifier's phase stability, further limiting the frequency response of the system.

Various circuits have been proposed to reduce problems caused by using high ohmage resistors for the feedback element including resistor networks created to reduce the size of any single element, and adding output buffer amplifiers to the design. These circuits have various undesirable side effects including increased offset, noise, and bandwidth tradeoffs, which are extensively documented in the prior art.

The use of optical feedback in electronic circuits is not new. U.S. Pat. No. 4,074,143 to Rokos (1978) discloses light emitting and light sensitive devices coupled together optically to create feedback. The disclosed information is related to the creation of positive feedback, which is not desirable within the present invention.

Other inventors have used optical feedback within an operational amplifier circuit. U.S. Pat. Nos. 5,189,307 and 5,283,441 to Fabian (1993, 1994) disclose the use of negative optical feedback within an operational amplifier circuit creating a system with unity gain to obtain electrical isolation. The disclosed information is instructional on obtaining a more precise unity gain system, which is not the goal of the present invention.

The use of optics to transform an input current into an output voltage proportional to the input current, which is the object of the present invention, is not unique. U.S. Pat. Nos. 4,652,764 and 4,752,693 to Nagano (1987, 1988) disclose such schemes. These disclosures do not indicate the use of an optical intensity modification within a feedback system to achieve gain. The gain of the current to voltage response of the system disclosed in U.S. Pat. No. 4,652,764 relies on the gain of transistor elements. The gain of a current ratio circuit, disclosed in U.S. Pat. No. 4,752,693 FIG. 6, relies on setting the relative intensity of two separate light emitting devices controlled by the relative current flowing though the devices. The gain of a second current ratio circuit, disclosed in U.S. Pat. No. 4,752,693 FIG. 8, would be created by selecting a reduced number of photo couplers within the input system compared to the number of photo couplers within the output system.

BRIEF SUMMARY OF THE INVENTION

In accordance with the present invention, a current to voltage conversion system is constructed comprised of an operational amplifier, where the operational amplifier obtains a feedback current from an optical detector which is equal to and opposite in magnitude to a single polarity input current. The output of the operational amplifier controls the intensity of a light source. The optical energy from the light source is transmitted through an optical intensity reduction mechanism, to generate a feedback current related to the illumination of the optical detector. A separate light intensity measurement system is constructed to measure the output of the light source directly, bypassing the effects of the optical intensity reduction mechanism. By measuring the light source directly, the magnitude of the input current can be determined. The increased illumination created by using an optical reduction mechanism within the operational amplifier's feedback loop allows the separate light source intensity measurement system to be easily constructed using conventional technologies.

In accordance with the present invention, the single polarity current to voltage conversion system is extended to convert bipolar input current to either single polarity or bipolar output voltage by adding additional light sources, optical reduction mechanisms and optical detectors to the single polarity system.

In accordance with the present invention, the bipolar input system is extended to use light intensity to offset the input signal by adding additional light sources. This extension reduces the systems noise and increases measurement stability when compared to using high ohmage resistors at the input of the operation amplifiers to change the offset. The high ohmage resistors add thermal and excess noise and creating resistors which are stable with temperature changes is very difficult.

Accordingly, besides the objects and advantages of constructing a current to voltage conversion scheme using optical feedback described in my above patent, several objects and advantages of the present invention are:

(a) to provide increased signal to noise performance;

(b) to provide a more stable circuit gain with respect to time, temperature and humidity;

(c) to provide faster response without operational amplifier phase stability problems; and (d) to provide a circuit that is simple to implement with reduced current leakage problems.

Still further objects and advantages will be apparent from a consideration of the ensuing description and drawings.

DETAILED DESCRIPTION OF THE INVENTION

Figure 1A:
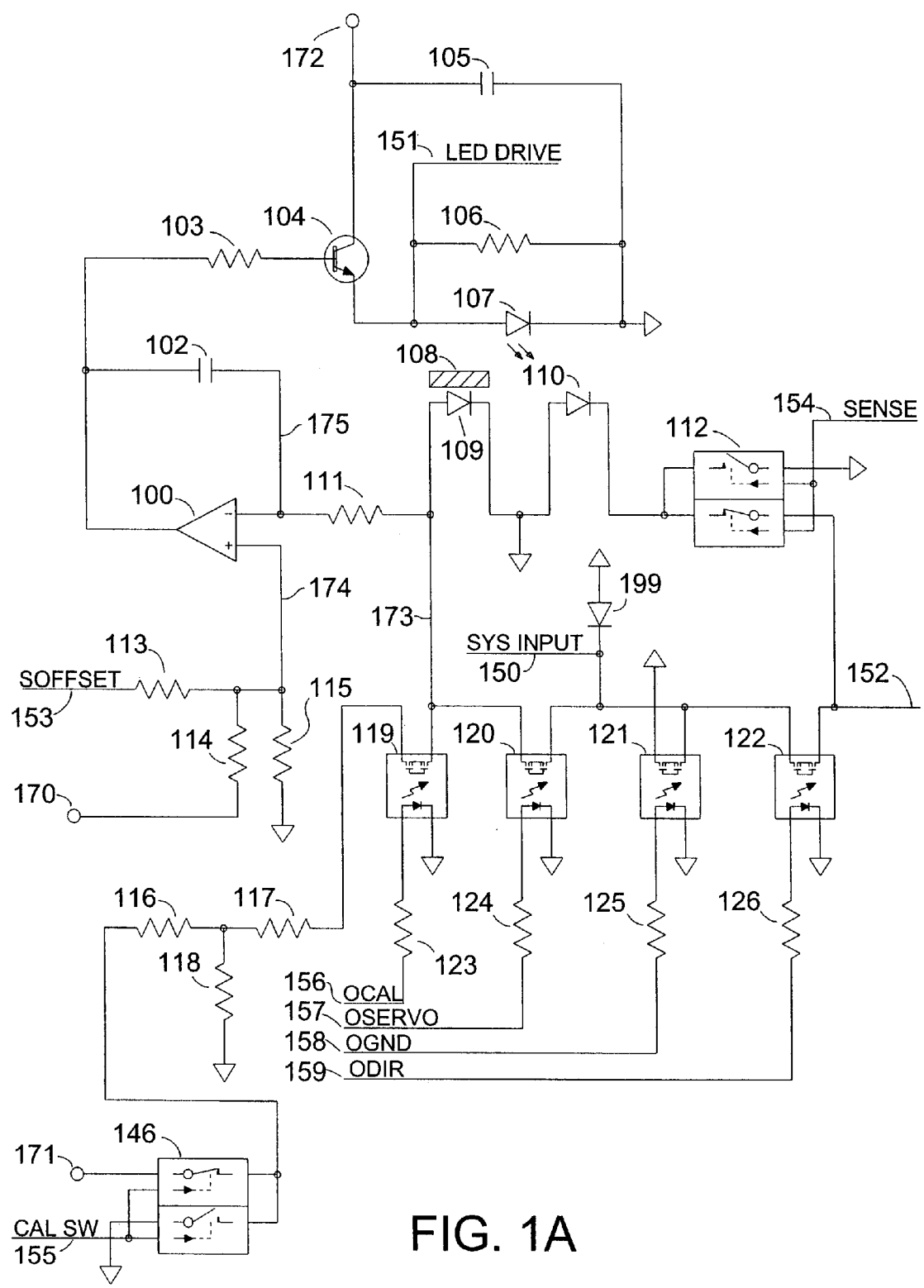
FIGS. 1A to 1C show the preferred electrical circuit diagram of a single polarity system.
Figure 1B:
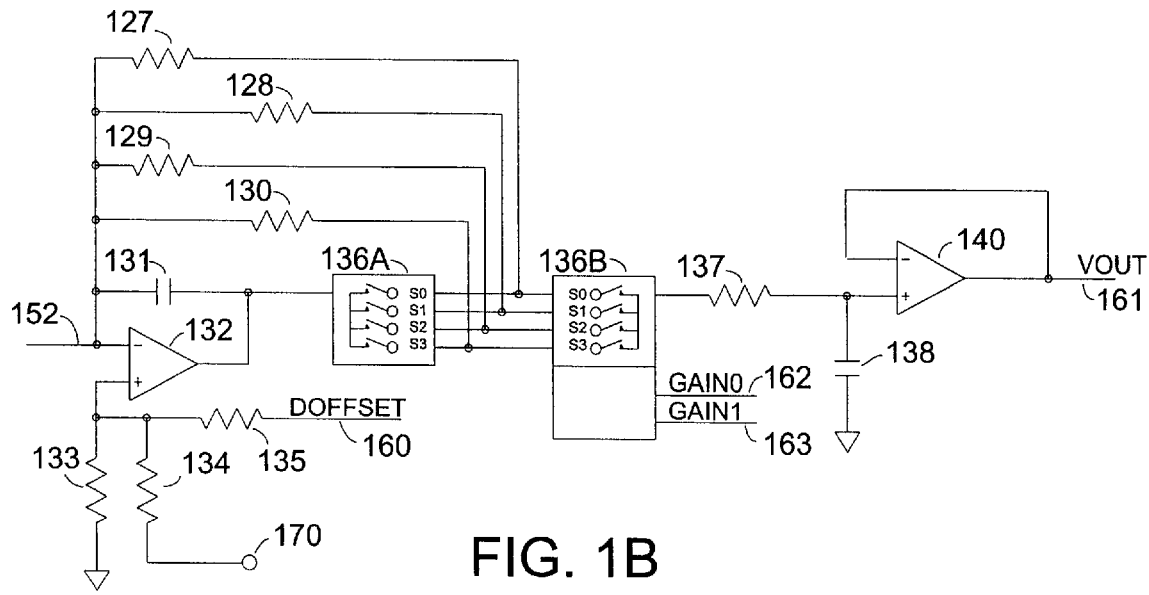
Figure 1C:
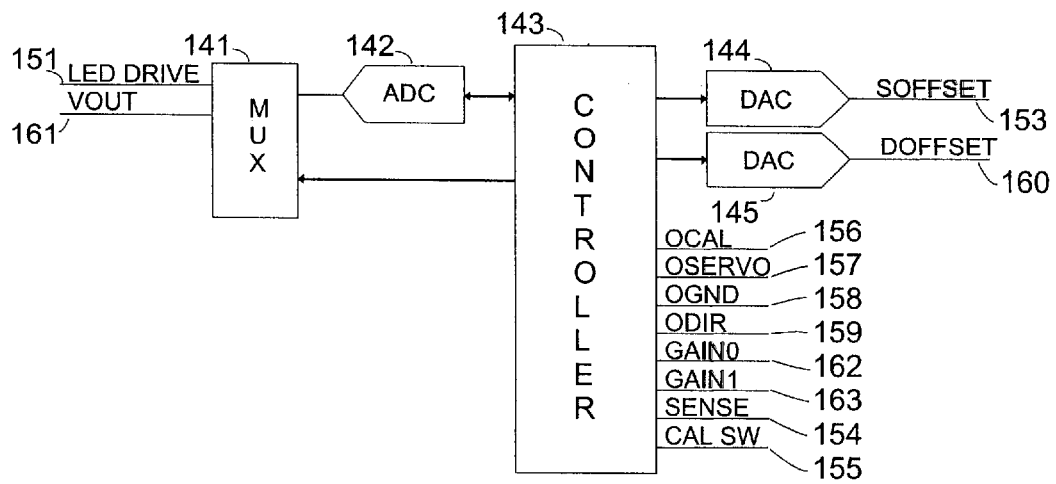

Description—FIGS. 1A to 1C—Preferred Single Polarity Circuit Embodiment.

A preferred embodiment of the current to voltage converter is illustrated in FIG. 1A (optical feedback stage), FIG. 1B (LED current measurement stage), and FIG. 1C (control system). The preferred embodiment described hereafter is limited to a single polarity of input current; changes to accommodate a bipolar input current are presented later with the description of FIG. 8. The present description will first explain the normal input current measurement configuration. Next, additional features allowing additional information to be derived, for example self-calibration of the optical gain, will be explained.

In the preferred embodiment, two operational amplifier circuits are implemented. The first operational amplifier circuit converts the input current level into a related light level. The second operational amplifier circuit converts the light level output of the first operational amplifier circuit into a voltage, which is the output of the system.

In the preferred embodiment, both operational amplifier's positive input nodes are connected to voltages very close to zero but the actual values are under software control to allow the operational amplifier offsets to be set.

In the first operational amplifier circuit, resistor 115 is selected to be 10 ohms, resistor 114 is 200K ohms, the node 170 is driven by a –2.5 volt source, resistor 113 is 100K ohms. When the voltage on node 153 (SOFFSET), provided by the digital to analog converter 144, is driven from 0 to 2.5 volts it can remove any small positive or negative offset from the operational amplifier 100.

In the second operational amplifier circuit, resistor 133 is selected to be 100 ohms, resistor 134 is 200K ohms, and resistor 135 is 100K ohms. When the voltage on node 160 (DOFFSET), provided by the digital to analog converter 145, is driven from 0 to 2.5 volts it can remove any small positive or negative offset from the operational amplifier 132.

The output of the digital to analog converter 145 is selected so that operational amplifier 132 has zero offset. The output of digital to analog converter 144 is selected so that operational amplifier 100 has a very slight positive offset. The values loaded into the digital to analog converters must be determined experimentally and will depend on slight deviations from ideal conditions within operational amplifiers 100 and 132. The method to obtain these digital to analog values will be forthcoming with the description of FIGS. 4, 5A and 5B.

In the system's normal operating condition, the input current to be measured is connected to node 150 (SYS INPUT). In the circuit, photo optical FET switches are used to control the direction of current flow. Photo optical switches, 119, 120, 121, and 122 are used due to the low leakage currents combined with the high-speed and long life operation of this switching technology. The preferred embodiment is implemented with Aromat part number AQV221 while other optically coupled solid state relay parts, standard CMOS switches, or standard low leakage relays can be successfully used. The configuration of this switching circuitry has been designed so that the switches can be configured to have approximately zero volts on each side of the switching node whenever possible to further reduce leakage.

The switching circuit's configuration is controlled by 143 (micro controller). A micro controller should be selected which generates low noise to avoid interfering with the sensitive analog circuits by electromagnetic coupling. In the preferred embodiment, a Micro Chip 16F874 processor is used, other processors can be selected. When the micro controller desires to close a photomos switch the LED within the switch package must be illuminated. To protect the micro controller output control lines, a resistor is used between the micro controller output signal and the LED in the switch. 1K ohms resistors 123, 124, 125, and 126 are used to protect the micro controller control lines 156, 157, 158 and 159 connected to switches 119, 120, 121, and 122 respectively.

To select the current measurement mode, the micro controller drives line 156 (OCAL) to 0 volts, which will open switch 119. The micro controller drives line 158 (OGND) to 0 volts, which will open switch 121. The micro controller drives line 159 (ODIR) to 0 volts, which will open switch 122. The micro controller drives line 157 (OSERVO) to 5 volts, which will close switch 120. Since all other current paths are open, closing switch 120 allows the input current to flow directly from the input to node 173.

Operational amplifier 100 should be a low noise, low current offset precision unit. The preferred embodiment was implemented with a Burr-Brown OPA124, other high performance operational amplifiers are useable based on cost performance tradeoffs.

In the preferred embodiment, resistor 111 is selected to be 10K ohms and capacitor 102 is selected to be 4 pF. Values should be selected for any proposed application of the circuit such that they limit the high frequency response of the system thereby reducing noise. The high input impedance of operational amplifier 100 allows resistor 111 to be replaced with a short-circuit when performing DC analysis of the circuit.

The positive input node 174 of the operational amplifier will be at approximately zero volts. When the operational amplifier is within linear feedback operation, the negative input node 175 must also be at approximately zero volts and the current flowing into the circuit, normally from node 150 (SYS INPUT), must be matched by an equal and opposite current generated by the photodiode 109. For optimal circuit noise performance this photodiode should have a high signal to noise ratio. In the preferred embodiment, a Hamamatsu S2386-18 photodiode was selected based on its signal to noise performance. Other photodiodes also offer good performance. A PIN type photodiode could be selected for this circuit's operation if a very fast operating circuit is desired.

The optical energy illuminating photodiode 109 comes from the light emitting diode (LED) 107. A Panasonic LN175 GaAlAs infrared LED was used in the preferred embodiment. Near infrared photodiodes will maximize the signal to noise response of the system due to the photodiode's sensitivity curve. The photodiode's response however is slightly temperature sensitive and this change in response increases with wavelengths longer than about 1000 nm. The ideal LED would have a wavelength output close to 950 nm so that photodiode's 109 signal to noise ratio is high but the sensitivity to the temperature change is reduced. However, for many applications, almost any common LED works well in the design as the LED is within the operational amplifier feedback loop so changes in the light output with time or temperature will be compensated for.

An optical light reducing mechanism that is shown on the schematic diagram as part 108 reduces the energy transmission from the LED 107 to the photodiode 109. The optical light reducing mechanism is shown on the schematic for clarity of explanation but has no electrical connections or operations when viewed using classical optics. If the light transmitted though the filter is considered an electromagnetic wave function then the light filter 108 has an electrical function. In the preferred embodiment, this light reducing part is an optical neutral density filter such as Hoya filter glass type ND-0.3 that can be obtained from Edmund Industrial Optics or similar optics supplier. This glass will reduce the light transmission from the LED to the photodiode by a factor of 333:1. Other types of optical filters or optical light apertures can be used in the design based on the desired level of optical gain, the environmental stability required of the light transmission level, and mechanical design tradeoffs. When using an optical filter, it should be selected for high environmental stability and relatively flat attenuation with wavelength changes near the LED's principle wavelength, which is why the solid absorbing type of glass filter was selected. It is simpler to make the optical filter stable with respect to time, temperature and humidity, than to make a very high ohmage resistor stable as is used in a traditional current to voltage conversion circuit.

The source of current used to drive the LED 107 is from a NPN transistor 104. The component's parameters are not critical and most NPN small signal amplifier transistors can be used for this application. A 2N3904 was used in the preferred embodiment. The transistor 104 is buffering the output of operational amplifier 100 using the beta of the transistor to reduce an experimentally encountered small heating effect within the operational amplifier, which otherwise distorted the circuit's response when converting a fast changing input current pulse. The operational amplifier 100 will control the drive level of current flowing into the base of the transistor through a 100 ohm resistor 103. The source of current to drive the collector of 104 is from node 172, a +15 volt power supply source. The voltage chosen for node 172 is not critical assuming the transistor 104 is operating within its linear region. A 0.1 uF capacitor 105 is connected close to transistor 104 to reduce high frequency noise coupling across the power supply system to the rest of the circuitry.

A 100K resistor 106, continues to pull current when the voltage at node 151 drops below the turn on voltage of the LED 107 and can be eliminated depending on the transitory response desired from the circuit.

To measure the level of input current flowing into node 150 (SYS INPUT), the output of LED 107 is measured by a second photodiode 110 without the light passing though reducing mechanism 108. The second photodiode 110 will generate a current level amplified when compared with input current at node 150 (SYS INPUT) by the optical gain set principally by 108. In the preferred embodiment, a Hamamatsu S2386-18 photodiode was selected for 110 based on its signal to noise performance. In some applications it might also be desirable to use a different type of photodiode with respect to photodiode 109 to change the relative response of the two photodiodes.

The current level created by photodiode 110 is measured by a traditionally designed linear feedback current to voltage conversion circuit. To enable the measurement of LED 107, the micro controller drives output 154 (SENSE) to enable current to flow across the CMOS switch 112 from photodiode 110 to input node 152. Resistors 127, 128, 129, and 130 set the gain level of the circuit and are selected in the preferred embodiment to be 1K, 10K, 100K, 1000K respectively, other values can be chosen. Capacitor 131, selected to be 100 pF, rolls off high frequency noise and ensures phase stability of operational amplifier 132. In the preferred embodiment, the Burr-Brown OPA124 is used for operational amplifier 132 but depending on the system requirements a lower cost part can be used as the Optical Gain System reduces the effects of any non-ideal performance by this operational amplifier on the system's performance. The CMOS switch 136A selects the resistor used for feedback based on the state of micro controller outputs 162 (GAIN0) and 163 (GAIN1). The CMOS switch 136B is configured to match the mode of switch 136A creating a Kelvin sense circuit that reduces the gain change caused by resistive variation of CMOS switch 136A with temperature. The output of CMOS switch 136B drives a low pass filter consisting of resistor 137, capacitor 138, and operational amplifier 140. In the preferred embodiment, a Maxim DG409 was selected for CMOS switches 136A and 136B, resistor 137 is 1K ohm, capacitor 138 is 0.01 uF, and the operational amplifier 140 is a Burr-Brown OPA177. Other part choices can be made for these parts without affecting the circuit's fundamental operation.

The output of operational amplifier 140, node 161 (VOUT), is multiplexed by switch 141 into the analog to digital converter 142 and read by the micro controller 143. The micro controller can further filter or process the signal as desired based on the circuit's application. In the preferred embodiment, a Maxim DG408 was implemented for switch 141, an Analog Devices AD977 16 bit analog to digital converter was implemented for part 142, and an Analog Devices AD5323 dual 12 bit digital to analog converter was implemented for parts 144 and 145. Other part choices can be made for these parts without affecting the circuit's fundamental operation.

The preferred embodiment has additional hardware control line 159 (ODIR), resistor 126, switch 122, control line 154 (SENSE), and the CMOS switch 112 to allow the system to measure the input to node 150 (SYS INPUT) without using optical gain when currents are large enough to employ only the current to voltage converter of the LED Measurement System. Driving 154 (SENSE) false causes the CMOS switch 112 to shunt photodiode 110 and isolate it from the LED Measurement System. Node 173 is isolated from the input node 150 (SYS INPUT) by setting control signal 157 (OSERVO) low to open switch 120. The micro controller drives control line 159 (ODIR) high to close switch 122 to connect the input to the LED Measurement System.

The preferred embodiment has additional hardware to allow calibration of the optical gain created by relative transmissions from LED 107 to photodiodes 109 and 110. The micro controller shorts the input 150 (SYS INPUT) to ground by closing 121, opens switch 120 to isolate node 173 from node 150 (SYS INPUT), and closes switch 119 to connect node 173 to one of two known current levels. The micro controller drives the logic state of 155 (CAL SW) controlling the CMOS switch 146 to select between the current levels. In the preferred embodiment, node 171 is a −2.5 volt source, resistors 116 and 117 are 1000K ohms and resistor 118 is 10 ohms, creating 0 and −25 pA calibration currents. The −25 pA current level could easily be changed if desired by modifying the values of 171, 116, 117 or 118. This feature can be easily omitted without affecting the circuit's operation but having the ability to perform a self-calibration allows the small change in the photodiode's temperature vs. current response curve to be calibrated out of the system as required. Controlling the temperature of the components can also eliminate this error.

The preferred embodiment allows the voltage across LED 107, (node 151 to ground) to be measured for testing of the LED. This feature can be eliminated if desired.

The signal to noise performance of the circuit presented can be significantly improved by reducing the absolute temperature of photodiode 109. Reducing the photodiode's temperature (which can be accomplished easily by using a thermoelectric cooler system) increases the shunt resistance of the photodiode, which reduces the device's Johnson noise. The shunt resistance will be increased by a factor of two for each reduction in device temperature of 5 to 10 degrees centigrade depending on the type of photodiode selected. Conversely, most photodiodes have a reduced sensitivity at long wavelengths with reduced temperatures. When creating a system to operate at a reduced temperature, the absolute temperature, the type of photodiode, the wavelength of the LED, and the maximum allowed temperature deviation range of the temperature control system should be optimized in concert with each other. A small improvement in the system's signal to noise performance can be obtained by also cooling photodiode 110 but the relative level of improvement is reduced by the gain of the optical feedback system.

If it is desirable to use the preferred embodiment with a signal of the reversed current input polarity, then reverse the circuit orientation of photodiode 109, modify the software controlled small offset of operational amplifier 100 to be of the opposite polarity, change the voltage polarity of node 171, and replace the NPN transistor 104 with a PNP transistor, and change the voltage polarity of node 172. The polarity of the output voltage with respect to the input current is arbitrary. It can be selected by changing the orientation of photodiode 110 with respect to 109.

If the preferred embodiment is used in a light measuring application and the optimal light detection device is a photodiode, then the photodiode 199 should be connected between node 150 (SYS INPUT) and the circuit's ground node, otherwise this photodiode 199 should be removed entirely or disconnected from the input node 150 (SYS INPUT).

Figure 2A:
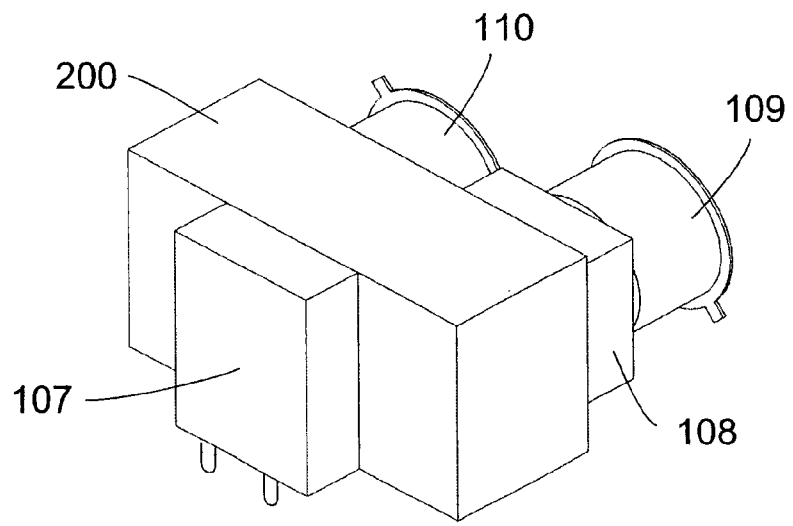
FIGS. 2A and 2B show the mechanical construction of the optical feedback module.
Figure 2B:
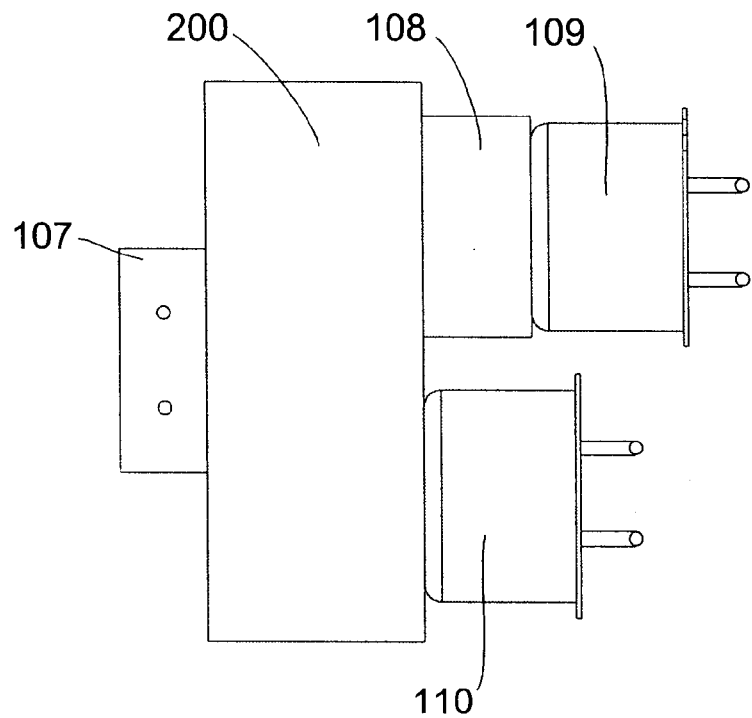

Description—FIGS. 2A and 2B—Preferred Mechanical Embodiment

A preferred embodiment of the optical feedback block is illustrated in FIG. 2A (Perspective View) and FIG. 2B (Bottom Orthogonal View). The electrical and optical parts are glued to a glass base block 200 used to support the parts in a fixed mechanical alignment. The type of glass in the block should be selected to pass the light wavelength of LED 107 with little loss. Standard quartz float glass is transparent for most types of LEDs. The thickness of the block in the light transmission path should be selected to allow the light to spread out enough to hit both photodiodes 109 and 110 at the same time. The block used in the preferred embodiment is approximately 5 mm thick. The LED 107 is glued to one face in the center of the block. The neutral density filter 108 is glued on the opposite side of the block covering only one half of the block's width to reduce the light projecting though the glass base block combined with the filter. Photodiode 109 is glued to the optical filter 108. Photodiode 110 is glued directly to the glass block 200. All gluing operations can be performed with low stress optical glue. In the preferred embodiment, Norland Optical Adhesive type 65 is used to mechanically bond the parts. After the gluing operation is completed, the block can be coated with a light blocking material if stray light can reach either photodiode 109 or 110 based on the block's mounting location. The coating compound should have a high electrical resistance if allowed to contact any photodiode part leads. Black Silicon sealing compounds have been used successfully.

Figure 3:
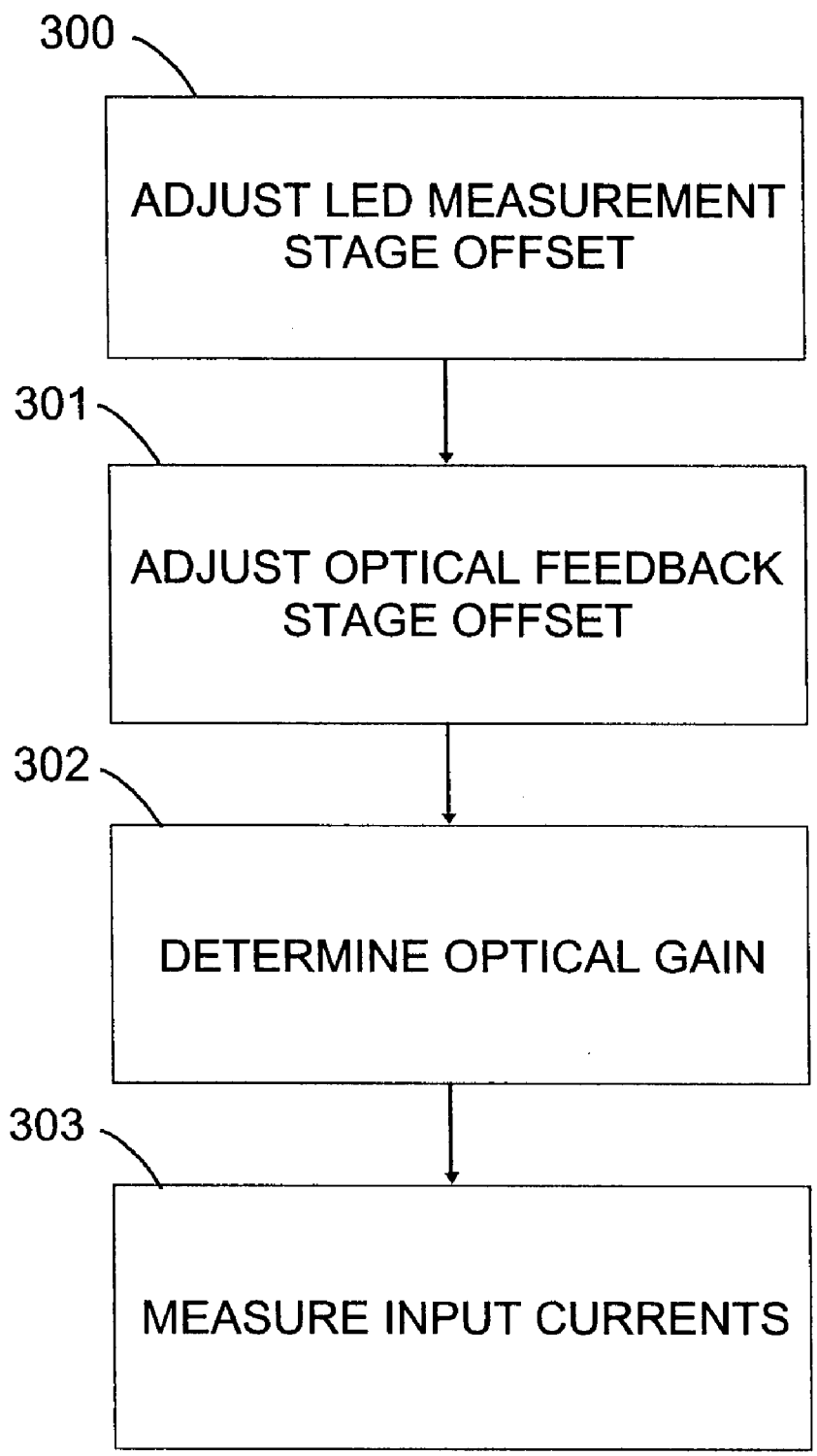
FIG. 3 shows the overall block diagram of software for the micro controller.

Description—FIG. 3—Preferred Overall Setup Sequence

Figure 4:
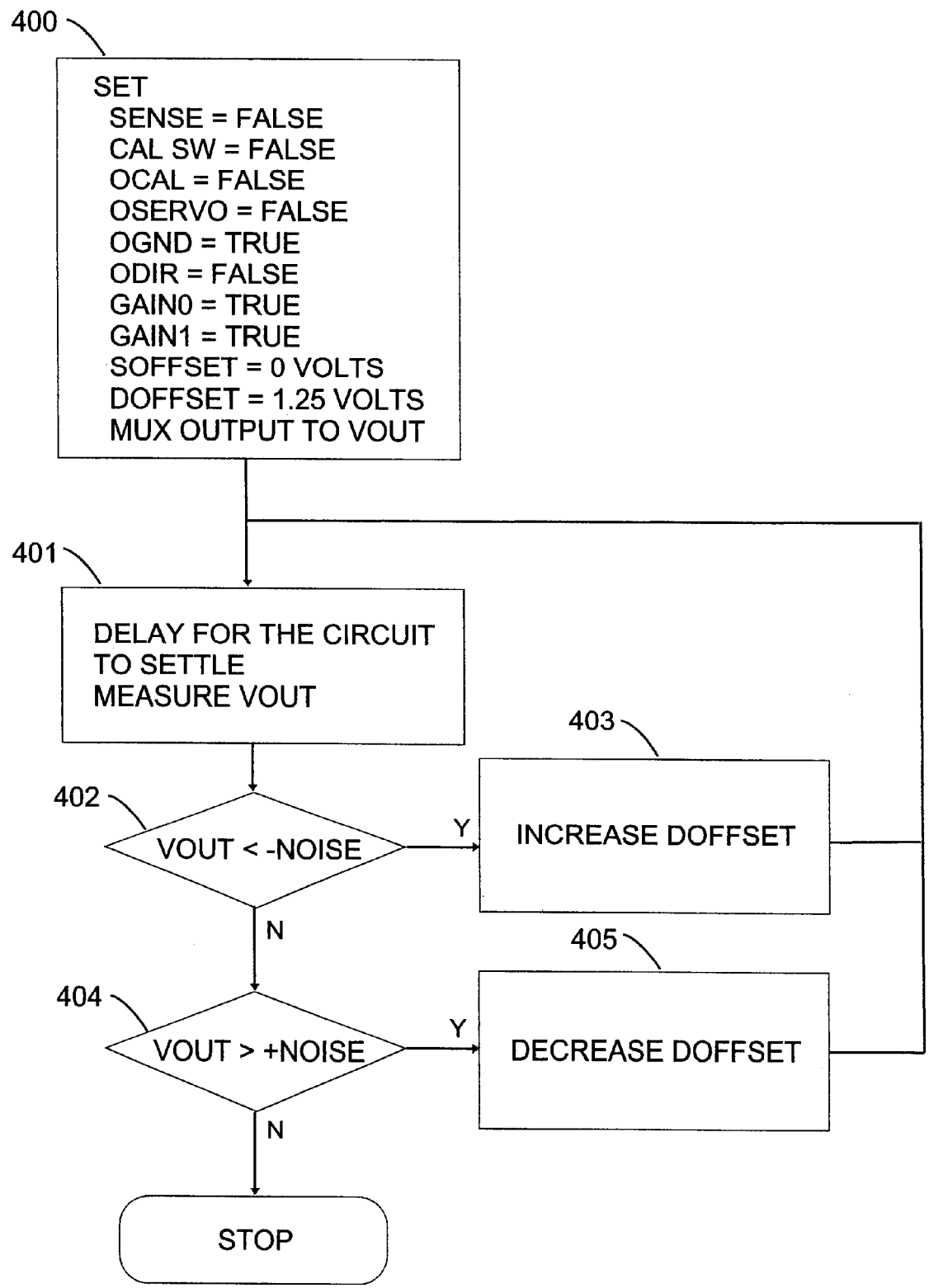
FIG. 4 shows the detailed block diagram for adjusting the LED Measurement System's offset.
Figure 5A:
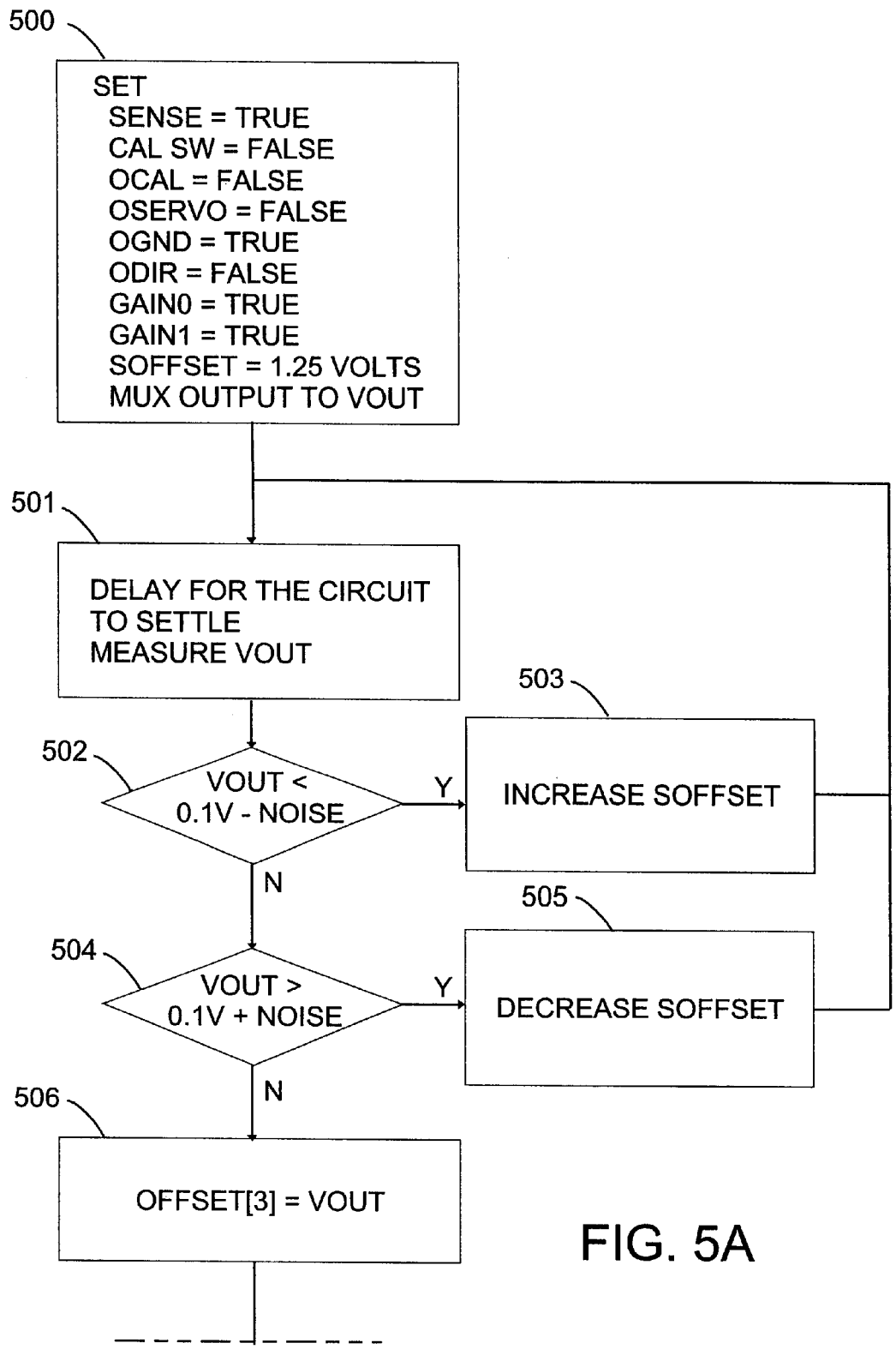
FIGS. 5A and 5B show the detailed block diagram for adjusting the Optical Feedback System's offset.
Figure 5B:
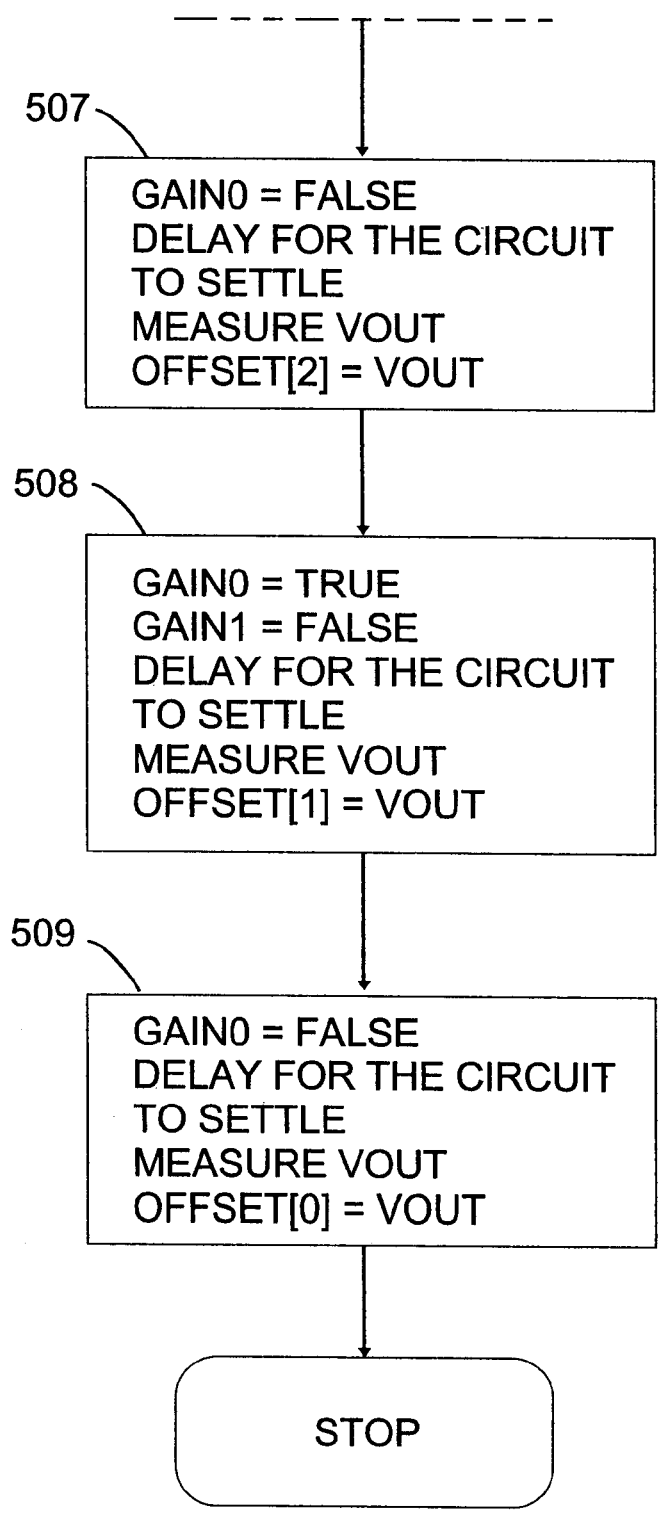

A preferred embodiment, to setup the measurement system is shown in FIG. 3. The first step, 300, adjusts the offset of the LED Measurement System's operational amplifier 132 to zero. FIG. 4 will describe the details of this step. The second step, 301, adjusts the input offset of operational amplifier 100 to a slightly positive voltage level. The positive offset is required because the LED 107 cannot generate negative current in the photodiode 109. FIGS. 5A and 5B will describe the details of this step. The third step, 302, internally calibrates the optical gain of the system. This process is described in detail in FIG. 6. The fourth step, 303, configures the system to measure the input current and is described in detail in FIG. 7.

Description—FIG. 4—Preferred LED Measurement Offset Adjustment Sequence

A preferred embodiment to set the offset of the LED Measurement System is shown in FIG. 4. The first step, 400, grounds the input by closing switch 121, shunts the photodiode 110 to ground with the CMOS switch 112, drives the input offset of operational amplifier 100 negative, sets the input offset of operational amplifier 132 to the value expected to generate zero offset, and maximizes the gain of the operational amplifier 132. The second step, 401, measures 161 VOUT. If the VOUT measurement is too low 402 or too high 404 then the voltage on node 160 is increased 403 or decreased 405 by the digital to analog converter 145 until zero plus or minus a small delta is achieved. The delta amount will depend on the minimum step size of the digital to analog converter 145 and circuit noise, so should be determined experimentally. The micro controller can, if desired, by averaging multiple measurements in step 401, reduce the effects of circuit noise.

Description—FIGS. 5A and 5B—Preferred Optical Feedback Offset Adjustment Sequence A preferred embodiment to adjust the Optical Feedback Offset is shown in FIGS. 5A and 5B. The first step, 500, grounds the input node 150 (SYS INPUT) by closing switch 121, disconnects node 173 from node 150 (SYS INPUT) by opening switch 120, grounds the calibration current source to reduce leakage across switch 119 which is open, connects the photodiode 110 to the LED measurement circuit using the CMOS switch 112, drives the input offset of operational amplifier 100 to the value expected to generate zero offset, and maximizes the gain of the LED measurement circuit. The offset of the LED measurement circuit is not changed from the value previously determined. The second step, 501 measures 161 VOUT. If the VOUT measurement is too low, 502, or too high, 504, then the voltage on node 153 is increased, 503, or decreased, 505, by the digital to analog converter 144 until 0.1 volts plus/minus a small delta is achieved. The delta amount will depend on the minimum step size of the digital to analog converter 144 and circuit noise, so should be determined experimentally. The micro controller can, if desired, by averaging multiple measurements in step 501 reduce the effects of circuit noise. In step 506 the offset is stored in an array indexed by the present gain. In steps 507, 508, and 509 the gain of the LED Measurement System is decreased and an offset value is stored for each gain range. The changes in the LED measurement circuit's gain will change the measured offset value.

Figure 6:
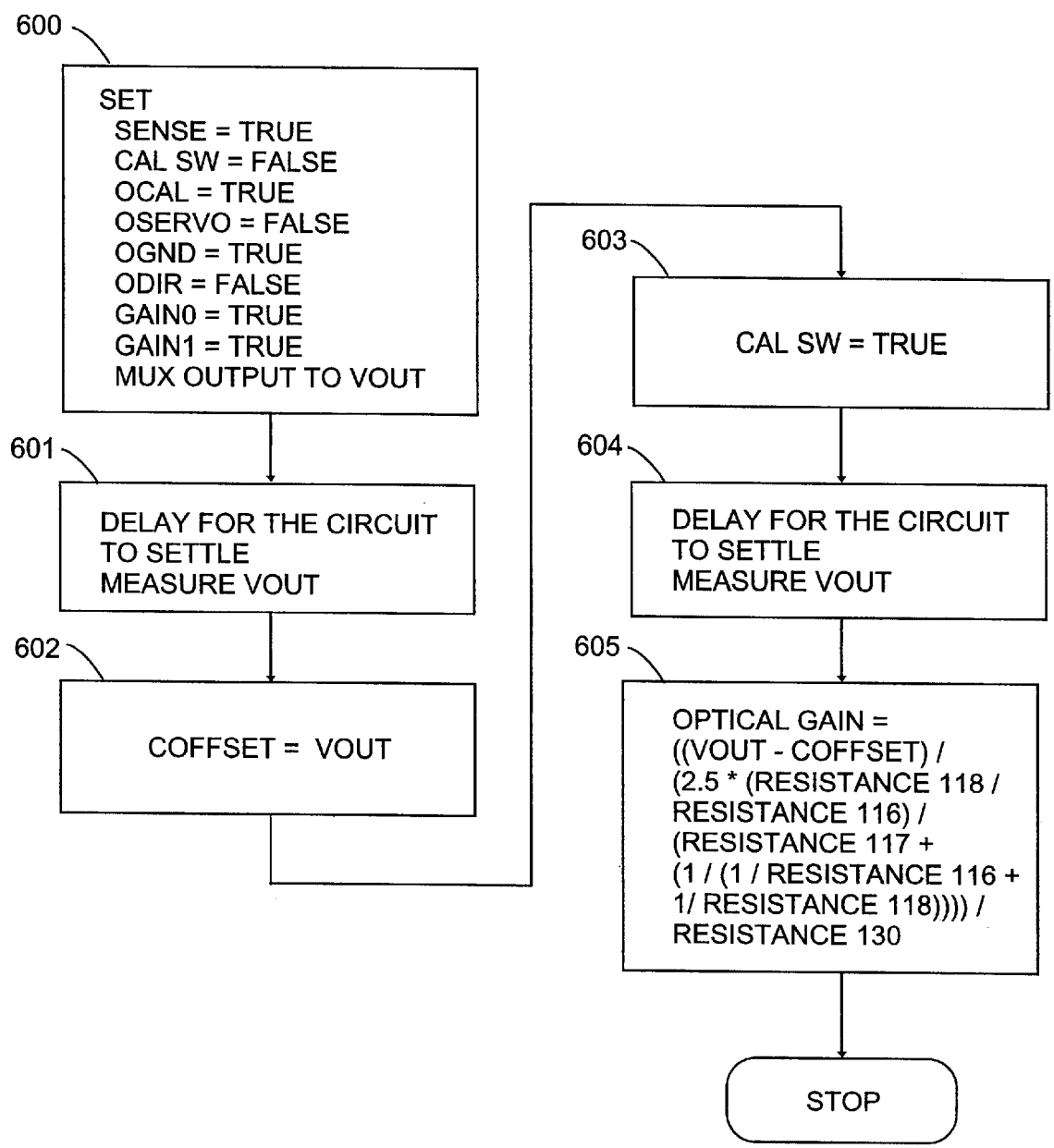
FIG. 6 shows the detailed block diagram for measuring the gain of the Optical Feedback System.

Description—FIG. 6—Preferred Optical Gain Calibration Sequence

A preferred embodiment to determine the optical gain is shown in FIG. 6. The first step, 600, grounds the input node 150 (SYS INPUT) by closing switch 121, disconnects node 173 from node 150 (SYS INPUT) by opening switch 120, connects the calibration current source to the input by closing switch 119, connects the photodiode 110 to the LED measurement circuit using the CMOS switch 112, maximizes the gain of the LED measurement circuit, and sets the calibration source to provide zero amps. Steps 601 measure and 602 saves 161 VOUT. Step 603 sets the calibration source for −25 pA. Step 604 measures 161 VOUT. Step 605 calculates the response to the delta current. The equation is flexible enough to handle any level of current creatable by changing the values of resistors 116, 117, 118, and 130.

Figure 7:
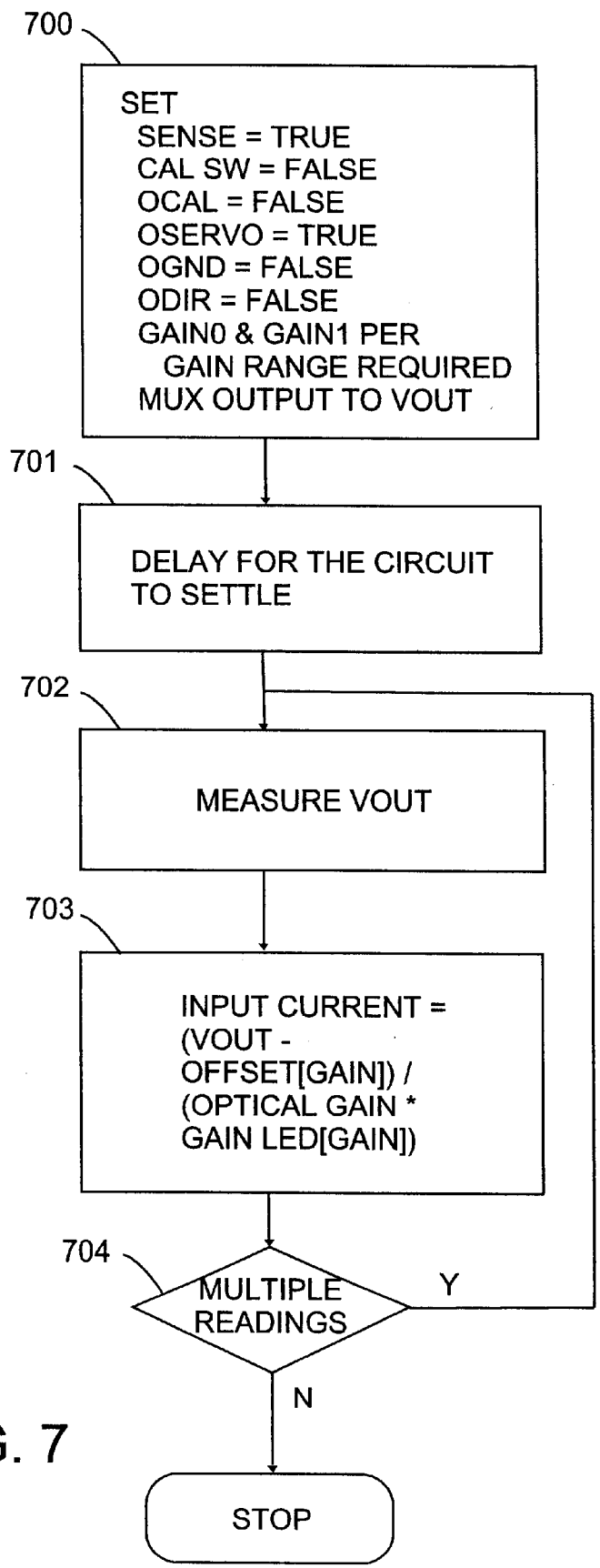
FIG. 7 shows the detailed block diagram for measuring unknown input currents.

Description—FIG. 7—Preferred Measurement Sequence

A preferred embodiment to measure input using the Optical Gain System is shown in FIG. 7. The first step, 700, opens switch 121, connects node 173 input to node 150 (SYS INPUT) by closing switch 120, grounds the calibration current source to reduce leakage across switch 119 which is open, connects the photodiode 110 to the LED measurement circuit using the CMOS switch 112, and sets the gain range of the LED Measurement System as desired. The second step, 701, delays as required for the hardware to stabilize. The third step, 702, measures 161 VOUT. The fourth step, 703, removes the predetermined offset based on gain, multiplies the optical gain and the LED Measurement System's gain to determine the magnitude of the input current. The last step, 704, loops back to step 702 to make multiple measurements if desired.

Figure 8:
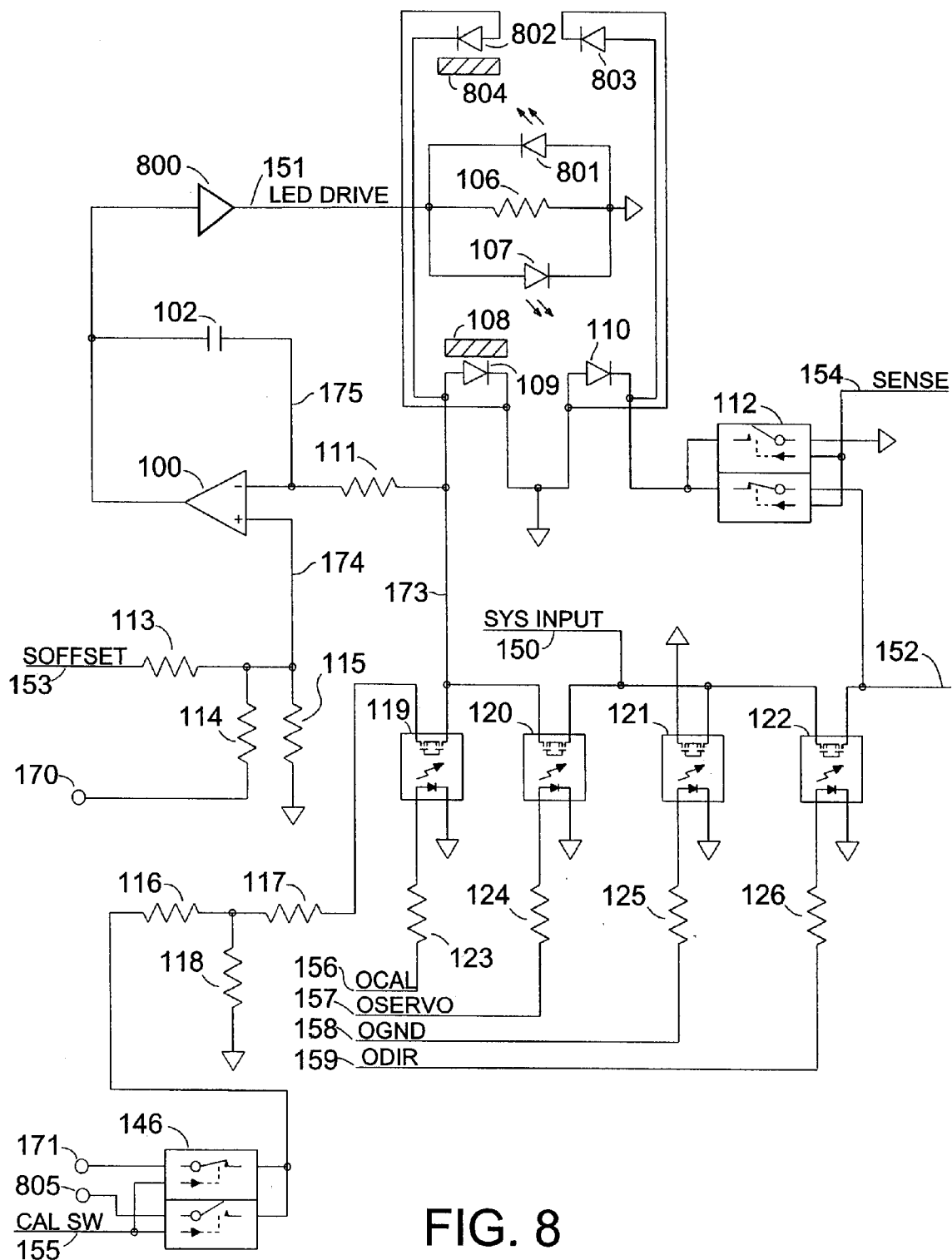
FIG. 8 shows the preferred electrical circuit diagram with the changes required to create a bipolar system.

Description—FIG. 8—Preferred Bipolar Circuit Embodiment

A preferred bipolar embodiment of the current to voltage converter is illustrated in FIG. 8 which is closely related to FIG. 1A (optical feedback stage). The operational amplifier output buffer, which consisted of resistor 103, transistor 104, voltage node 172, and bypass capacitor 105 are replaced with an amplifier 800, which can drive both output polarities. A buffer amplifier normally used to drive 50 ohm cable loads will work well in this application and is constructed by many IC vendors, for example an Analog Devices BUF04. A second LED 801 is added to illuminate on the negative going drive voltage. A second neutral density filter 804 has been added. Additional photodiodes 802 and 803 have been installed in the optical feedback system and LED Measurement System respectively. Alternatively, the LED Measurement System can use both photodiodes 110 and 803 connected in the same circuit orientation if the input signal magnitude is to be rectified before output. The optical intensity of each feedback system must be separated; two possible options include mechanical design or using wavelength separating filters combined with LEDs of different wavelengths. The input to the CMOS switch 146 has been changed to create a plus and minus 25 pA calibration source by changing the ground input to a +2.5 volt source 805. The software in the micro controller is modified to zero the offset of the feedback control system. The software of the calibration system is changed to measure the zero input current by opening switch 119 as opposed to changing the state of 155 (CAL SW), which now controls the polarity of the calibration signal. Separate positive and negative offsets and gains should be calculated by the software system. The detailed changes to the software will be straightforward to someone skilled in the art, when the single polarity system is understood.

Figure 9A:
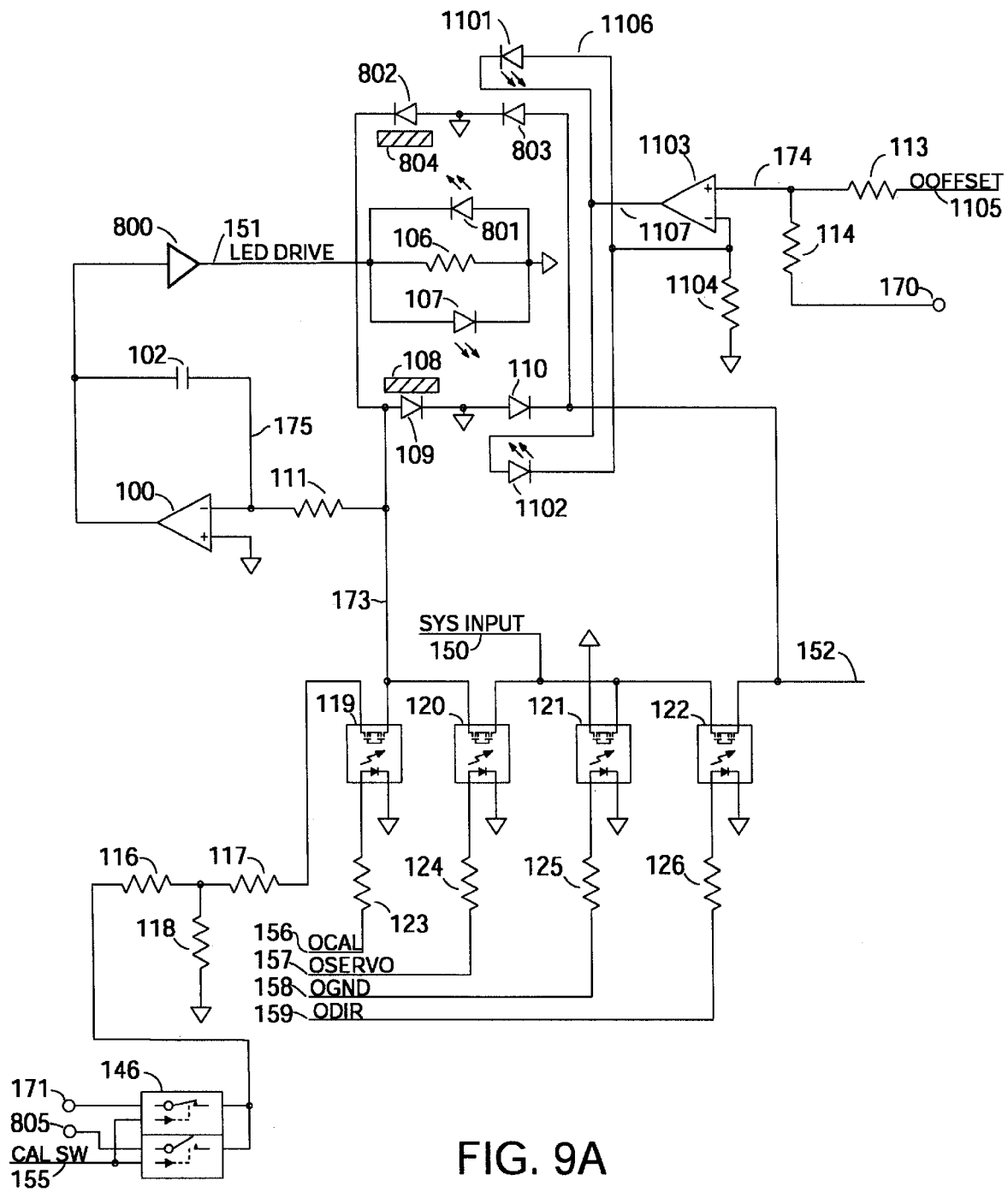
FIGS. 9A, 9B, and 9C show the preferred electrical circuit diagram of a bipolar system modified to adjust for offsets using controlled light sources.
Figure 9B:
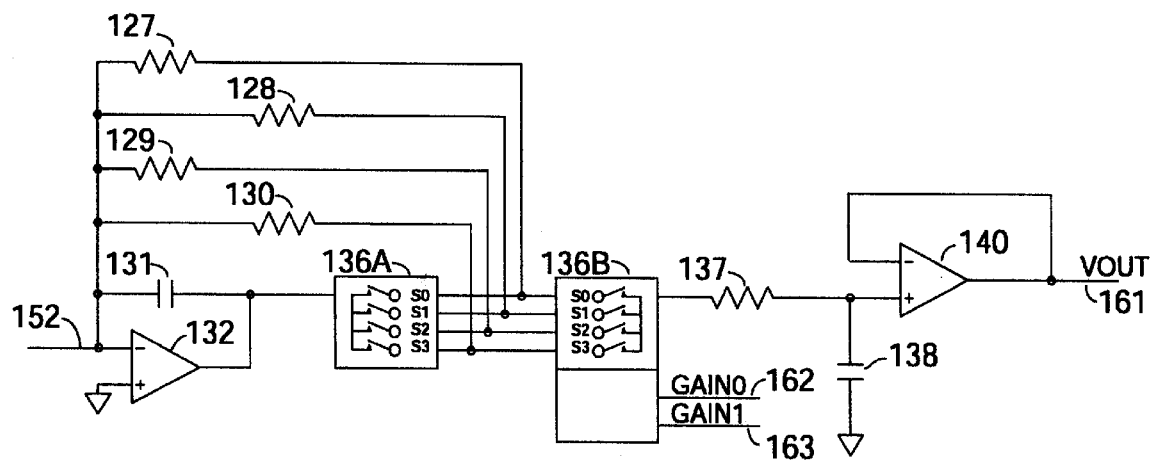
Figure 9C:
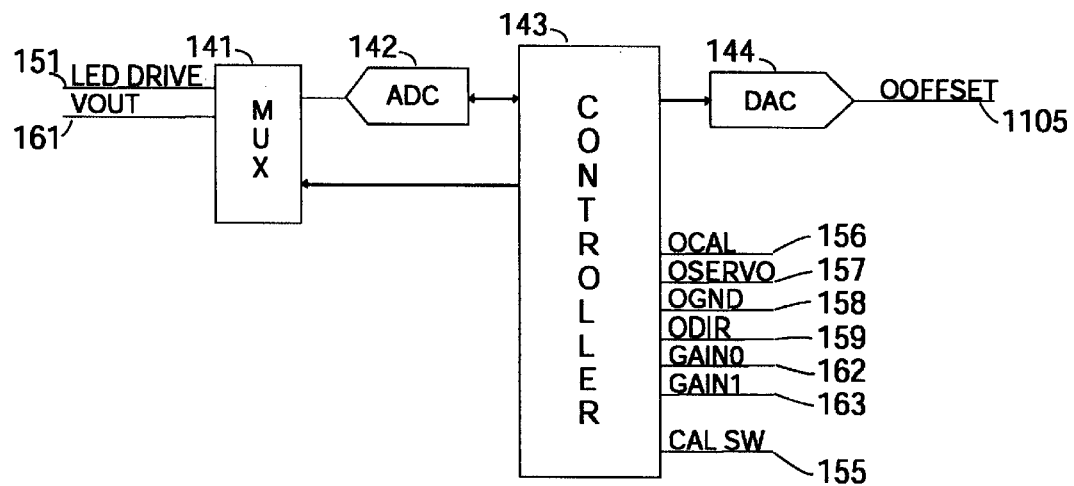

Description—FIGS. 9A and 9B—Preferred Bipolar Circuit Embodiment with Optical Offset A preferred bipolar embodiment of the current to voltage converter with an optical offset method is illustrated in FIGS. 9A and 9B which is closely related to FIG. 8 (Bipolar Circuit Embodiment). The non-inverting inputs to operational amplifiers 100 and 132 are now directly grounded. The DAC 145 is removed and the DAC 144 is connected to a new signal node 1105 (OOFFSET). A third LED 1102 is added to illuminate photodiode 110, but not photodiode 108, with the intensity controlled by the voltage level of 1105. The current to drive the LED 1102 is supplied by the operational amplifier 1103 which can be any operation amplifier that can supply the required output current to drive the LED 1102. A reasonable part selection for the operational amplifier 1103 would be a Texas Instruments TLC070 which can supply plus or minus 20 mA at the output. The non-inverting input of operational amplifier 1103 is connected to 174 and inverting input of 1103 is connected to node 1106. The output voltage level 1107 will change as required to drive a current level through LED 1102 so that the voltage drop across resistor 1104 is equal to the voltage on 174 when 174 is a positive voltage. Due to the low offsets of operational amplifiers 100 and 132 the resistance of 1104 can be relatively large compared to a typical LED drive current dropping resistor, for example, 10,000 ohms. A fourth LED 1101 is configured to illuminate photodiode 803 but not 802 when the voltage on node 174 is negative. The software in the micro controller 143 is modified to zero the offset of the feedback control system by controlling the intensity of either LED 1101 or 1102. The detailed changes to the software will be straightforward to someone skilled in the art, when the dual polarity system is understood.

In the embodiment shown in FIG. 9A, the negative feedback loop across operational amplifier 100 includes two light attenuators 108, 804, as in the embodiment in FIG. 8. The attenuation of the light provided by filters 108, 804 preferably ranges between a factor of about 20 and about 2000, depending on the application, particularly on how small of an input current is desired to be measured. A factor of 7000 has experimentally proved successful, and a factor of at least about 100,000 is believed to be possible. The upper limit of the factor is limited only by the gain-bandwidth product specified for the operational amplifier.

Figure 10A:
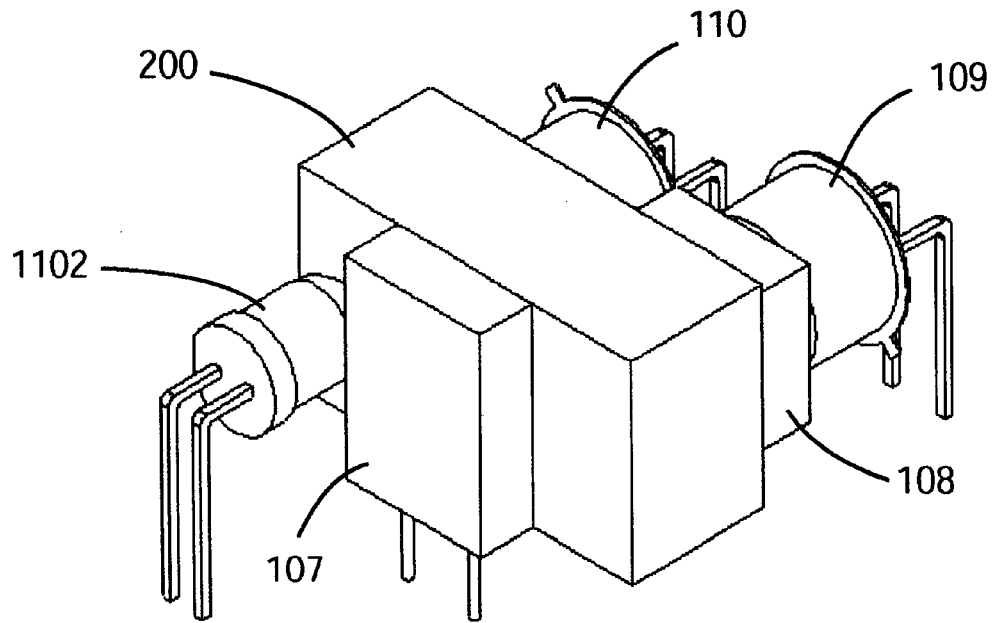
FIGS. 10A and 10B show the mechanical construction of an optical feedback module as connected as shown in FIGS. 9A–9C.
Figure 10B:
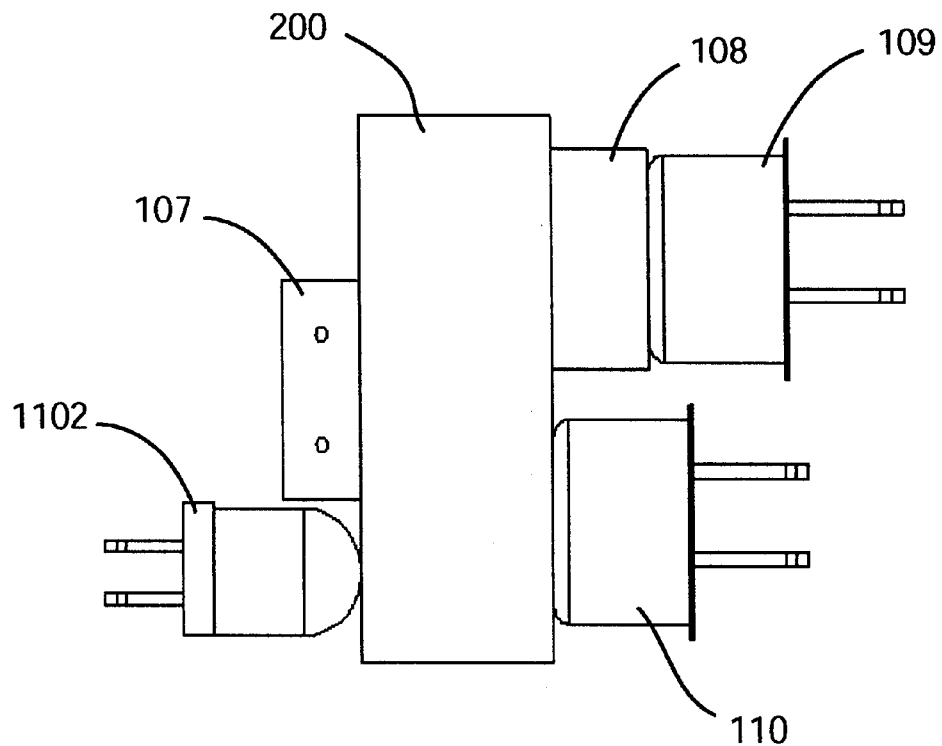
Figure 11:
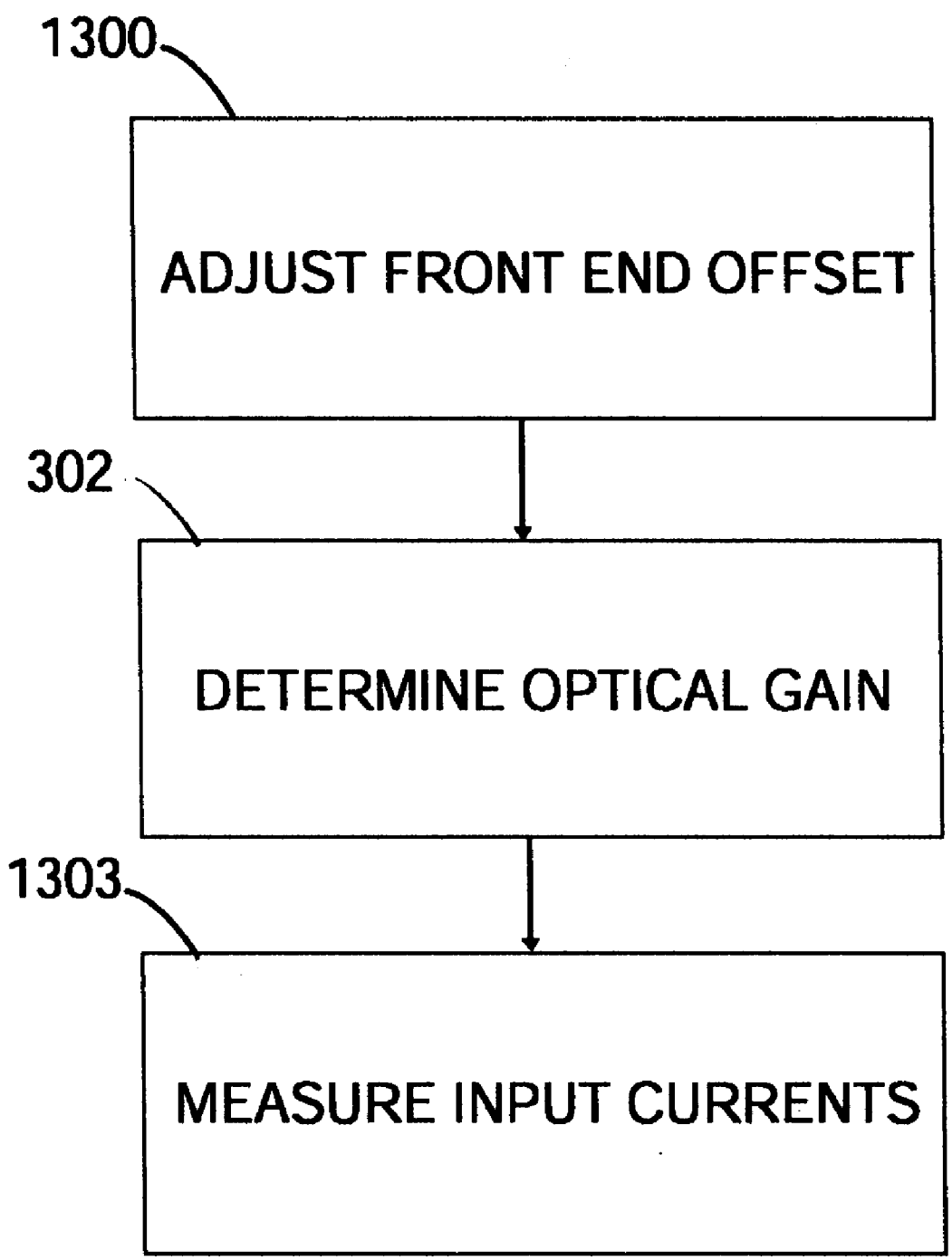
FIG. 11 shows the overall block diagram of the software for the micro controller for the circuit of FIGS. 9A–9C.
Figure 12A:
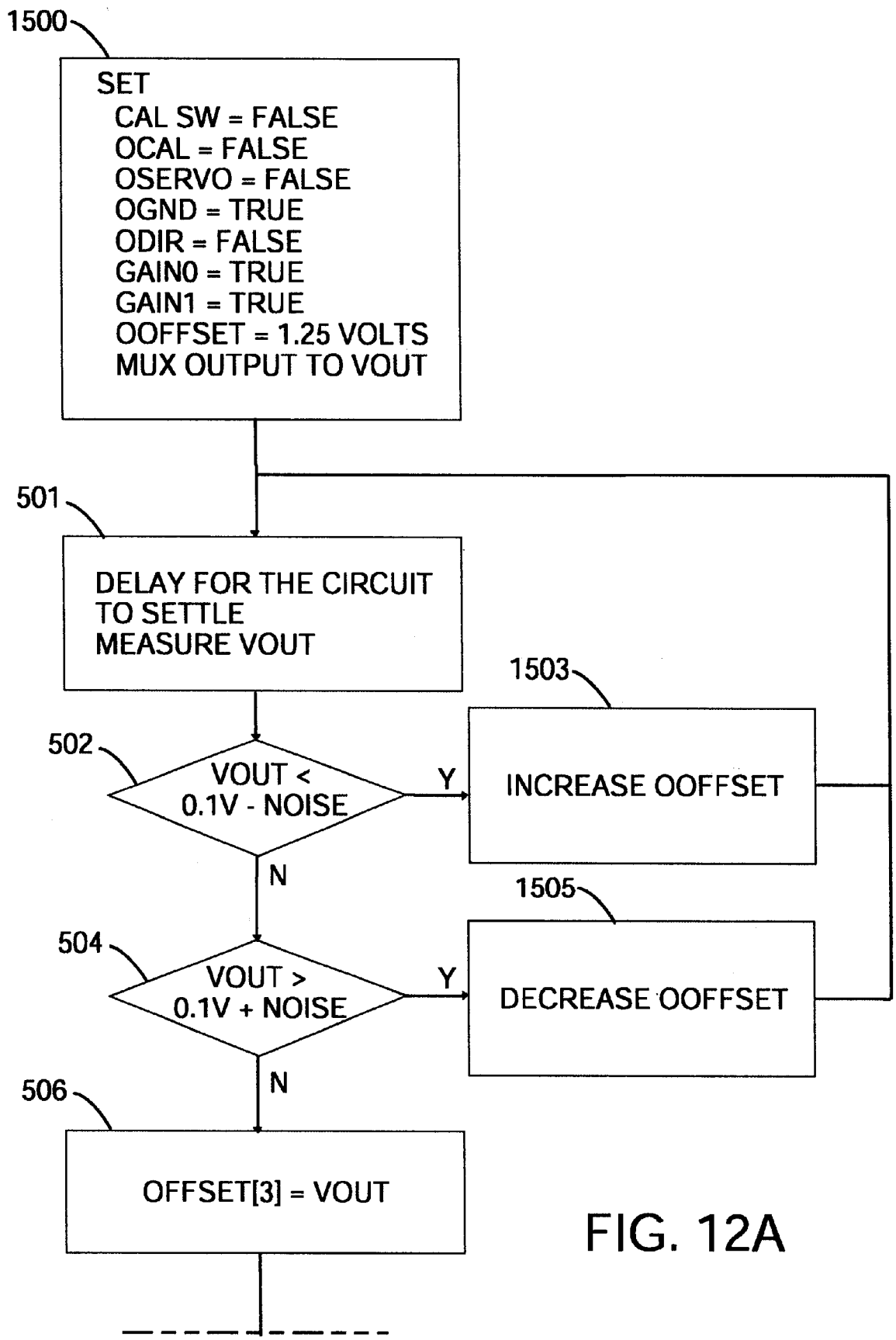
FIGS. 12A and 12B show the detailed block diagram for adjusting the optical feedback system's offset by controlling the light intensity.
Figure 12B:
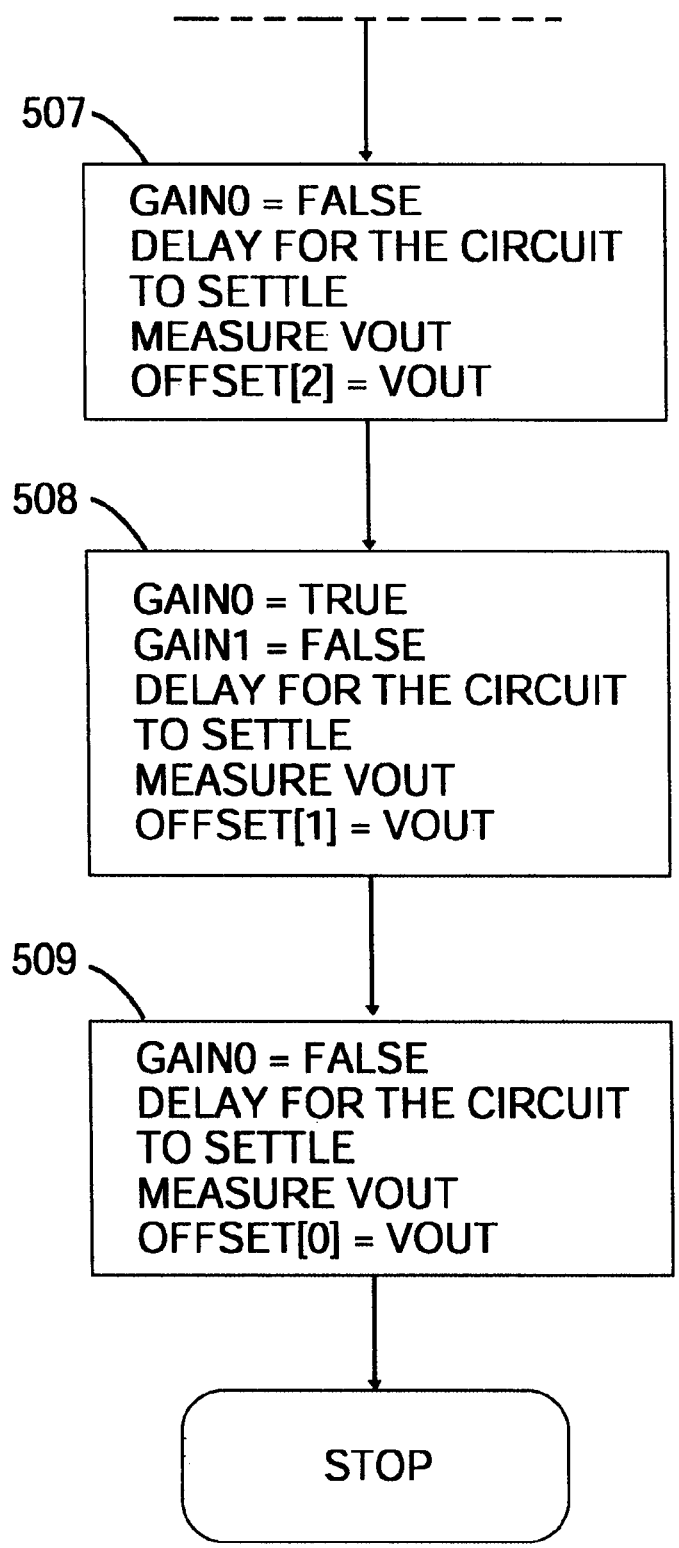
Figure 13:
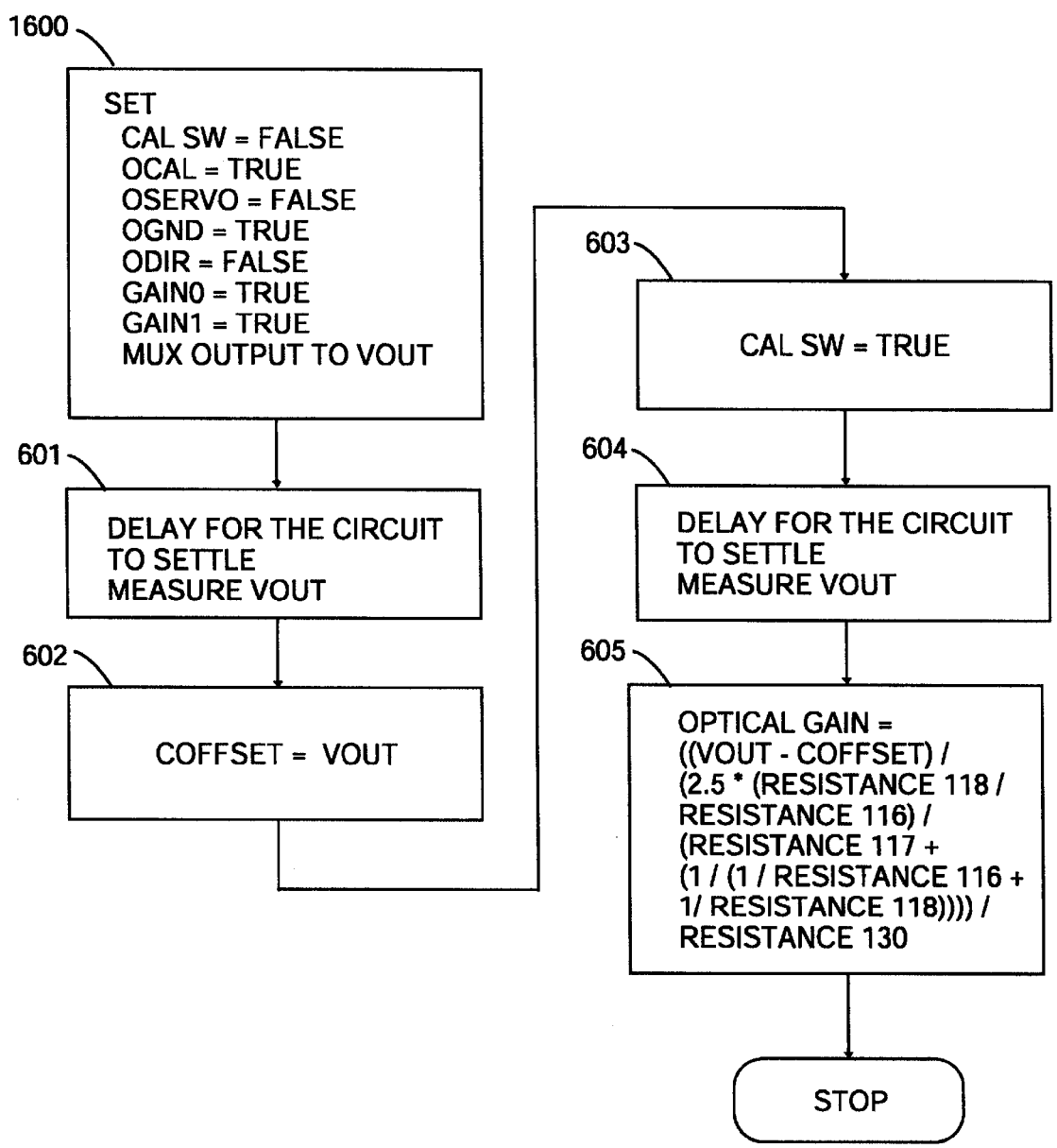
FIG. 13 shows the detailed block diagram for measuring the gain of the optical feedback system with the light intensity offset method.
Figure 14:
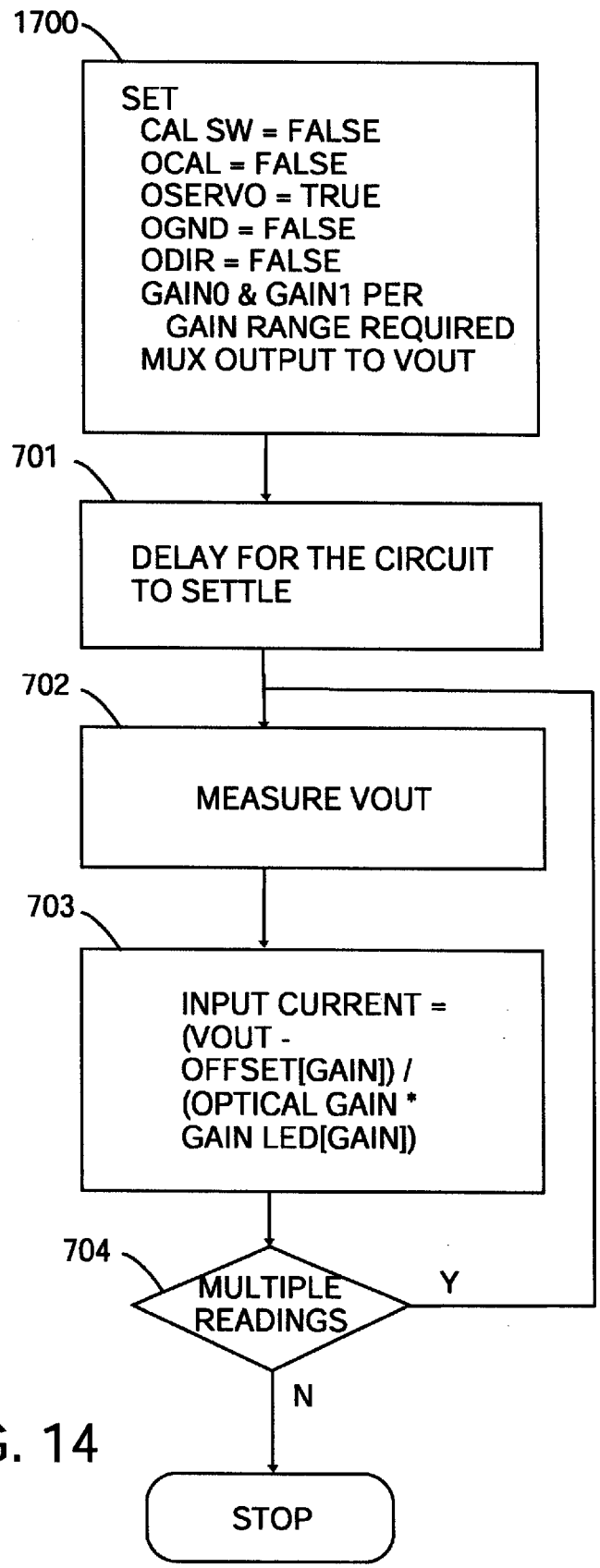
FIG. 14 shows the detailed block diagram for measuring unknown input currents with the light intensity offset method.

Description—FIGS. 10A and 10B—Preferred Mechanical Embodiment with Optical Offset A preferred embodiment of the optical feedback block with the offset LED source added is illustrated in FIG. 10A (Perspective View) and FIG. 10B (Bottom Orthogonal View). The change is from FIGS. 2A and 2B are very minor adding LED 1102. It is desirable for the output from LED 1102 to illuminate photodiode 110 but not 109 therefore a LED with a small dispersion angle is selected. Alternatively it would be straightforward to someone skilled in the art to use a light baffling mechanism to block light emitted by LED 1102 which would otherwise hit photodiode 109.

Description—FIGS. 11, 12A, 12B, 13, and 14—Preferred Software Flow Charts with Optical Offset The preferred software flow charts are almost identical to FIGS. 3, 4, 5, 6, and 7, with simplifications made because only one offset adjustment for the system is required. Implementing these changes would be straightforward to someone skilled in the art.

Conclusion, Ramifications and Scope

Accordingly, the reader will see that the optical gain based current to voltage conversion system of this invention can measure single or bipolar input currents of a very small magnitude.

The system obtains increased signal to noise performance because the signal to noise performance of the photodiode used to create current feedback is greater than the signal to noise performance of the high value resistor or resistor network required in known prior art.

The system's signal to noise performance is improved much more rapidly by reducing the temperature of the photodiode components than can be obtained by reducing the temperature of the feedback resistor network within the known prior art.

The stability of the optical reduction scheme is extremely high due to the use of a stable absorptive glass filter in a fixed mechanical configuration. Alternative light reduction schemes based on a light aperture system can also be constructed with high stability. Light splitting schemes such as light reflections off surfaces compared to light transmission through surfaces also create stable optical intensity ratios. The optical feedback innovation relies exclusively on the current ratio generated by one optical detector compared to the other optical detector when viewing the same light source without regard as to how that ratio was created. Techniques useful for creating a ratio include current versus intensity variations of the photodiodes, photodiode size ratios, optically absorbing or reflecting mechanisms, or a combination of these techniques.

The well known near ideal performance of photodiodes with respect to intensity level when connected to the virtual ground node of a current to voltage converter will create a very linear system response curve.

The high speed response of the small area photodiodes combined with the close to zero voltage change required within the photodiode feedback system creates a system with high speed response and without the traditional circuit's operational amplifier phase stability problems.

Optical coupling of the output to the operational amplifier's input allows large separations to be employed, which reduce current leakages that are a problem with traditional designs.

Although the description above contains many specificities, these should not be construed as limiting the scope of the invention but as merely providing illustration of the present preferred embodiment of this invention. For example, the mechanical construction of the optical feedback system could be changed in shape, the optical light ratio mechanism could be generated differently, the system or parts thereof can be implemented within an integrated package, and various circuit components and structures can be changed without impacting the basic concept.

The foregoing description of the preferred embodiment of the invention has been presented for purposes of illustration and description. It is not intended to be exhaustive or to limit the invention to the precise form disclosed, and many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined only by the claims of any patent that ultimately issues from this or a subsequent application.

I claim:

1. An electro-optical circuit for measuring an input current, the circuit comprising:
   a first amplifier including an input and an output, the amplifier input configured to be coupled to the input current;
   a negative feedback loop coupled between the output and the input of the first amplifier, the negative feedback loop including a first light source coupled to the output of the first amplifier, the first light source producing a light at an intensity, the negative feedback loop further including a first light detector and a light attenuator reducing by an attenuation factor the intensity of the light transmitted from the first light source to the first light detector, the first light detector providing a negative feedback signal to the first amplifier input; and
   a light measurement system receiving light from the first light source substantially without attenuation by the light attenuator.

2. The circuit of claim 1 wherein the light measurement system includes a second light detector receiving light from the first light source, the second light detector producing a signal in response to the light.

3. The circuit of claim 2 wherein the second light detector is optically coupled directly to the first light source.

4. The circuit of claim 2 wherein the signal produced by the second light detector is a current that is sensed by a resistor-feedback operational amplifier circuit to produce the output signal as a voltage.

5. The circuit of claim 4 wherein the resistor-feedback operational amplifier circuit includes a plurality of feedback resistors, wherein the resistors are selectable for variable gain.

6. The circuit of claim 5 wherein the resistors are selectable by a switch that includes a Kelvin sense circuit.

7. The circuit of claim 1 wherein the light measurement system includes a second amplifier and a switch, the second amplifier configured to be selectively coupled by the switch either to the first light source or to the input current, the switch bypassing the first amplifier when selectively set to couple the second amplifier to the input current.

8. The circuit of claim 1 further comprising an input photodetector configured to produce the input current in response to an input light signal.

9. The circuit of claim 1 wherein the input current is bipolar and the circuit is configured to measure the input current bipolarly.

10. The circuit of claim 1 further comprising a calibration circuit for providing a test current in place of the input current and a switch for coupling the test current to the input of the first amplifier.

11. The circuit of claim 1 wherein the first light source is an LED, the first light detector is a photodiode, and the light attenuator is a neutral density filter.

12. An apparatus for converting an input current into an output signal, the apparatus comprising:
   a first amplifier including an input and an output, the amplifier input configured to be coupled to the input current;
   a first light detector coupled electrically to the input of the first amplifier;
   a first light source coupled to the output of the first amplifier, the first light source producing light generally in proportion to a signal at the output of the first amplifier;
   a light attenuator receiving light from the first light source and attenuating by an attenuation factor the light transmitted from the first light source to the first light detector, the first light detector producing a current in response to the attenuated light, wherein the first light detector and the first light source are coupled to the first amplifier to fix the current produced by the first light detector to be generally equal and opposite in polarity to the input current; and
   a light measurement system receiving light from the first light source substantially without attenuation by the light attenuator, the light measurement system configured to produce the output signal.

13. The apparatus of claim 12 wherein the light measurement system includes a second light detector coupled to the first light source, the second light detector producing a current in response to the first light source.

14. The apparatus of claim 13 wherein the current produced by the second light detector is larger than the current produced by the first light detector by about the attenuation factor.

15. The apparatus of claim 12 wherein the light measurement system includes a second light detector receiving the light from the first light source and a second amplifier coupled to the second light detector, the second amplifier including a plurality of selectable feedback resistors to vary the gain of the second amplifier.

16. The apparatus of claim 15 wherein the light measurement system further includes a low pass filter coupled to the second amplifier.

17. The apparatus of claim 12 further including a programmed microcontroller and switching circuitry controlled by the microcontroller, the switching circuitry configured to selectively couple and decouple the first amplifier input to and from the input current.

18. The apparatus of claim 17 wherein the microcontroller is configured to receive the output signal and compensate automatically for variations in circuit parameters.

19. The apparatus of claim 12 further including a programmed microcontroller for automatic testing of the apparatus.

20. An apparatus for converting an input signal to an output signal, the apparatus comprising:
   a first amplifier including an input and an output, the amplifier input configured to be coupled to the input current;
   a first light detector coupled electrically to the input of the first amplifier;
   a first light source coupled to the output of the first amplifier, the first light source producing light generally in proportion to a signal at the output of the first amplifier;
   a light attenuator receiving light from the first light source and attenuating by an attenuation factor the light transmitted from the first light source to the first light detector, the first light detector producing a current in response to the attenuated light;
   a light measurement system including a second light detector receiving light from the first light source substantially without attenuation by the light attenuator; and
   an offset adjustment circuit coupled to the light measurement system, the offset adjustment circuit including a second light source transmitting light to the second light detector.

* * * * *